United States Patent [19]

Murata et al.

[11] Patent Number: 5,583,887
[45] Date of Patent: Dec. 10, 1996

[54] TRANSMISSION SIGNAL PROCESSING APPARATUS

[75] Inventors: Hiroyasu Murata; Takashi Kaku, both of Kawasaki, Japan

[73] Assignee: Fujitsu Limited, Kawasaki, Japan

[21] Appl. No.: 31,621

[22] Filed: Mar. 15, 1993

[30] Foreign Application Priority Data

Mar. 13, 1992 [JP] Japan ..................... 4-054960

[51] Int. Cl.$^6$ .............. H03H 7/30; H04L 27/04
[52] U.S. Cl. .......... 375/229; 375/295; 375/377; 364/724.1
[58] Field of Search ............ 375/12, 122, 229, 375/230, 295, 296, 285, 377; 364/724.1, 577, 572; 348/720, 538; 370/69.1

[56] References Cited

U.S. PATENT DOCUMENTS

4,716,472 12/1987 McNally ..................... 364/724.1
5,214,676 5/1993 Wilkinson .................. 364/724.1
5,253,043 10/1993 Gibson ....................... 348/720

*Primary Examiner*—Tesfaldet Bocure
*Attorney, Agent, or Firm*—Staas & Halsey

[57] ABSTRACT

A roll off filter portion for an input transmission point signal executes a roll-off filtering process and an interpolation process with a multiple of two at the same time. The roll-off filtering process is adapted to form a frequency spectrum characteristic in a cosine roll-off shape for the input signal. An interpolator portion, connected to the roll-off filter portion, executes an interpolation process with a multiple of two. This process is a filtering process for forming a frequency spectrum characteristic in a cosine roll-off shape for an input signal. Depending on what multiple of the original sampling frequency a transmission point signal is interpolated, a corresponding number of the interpolator portions are connected in a cascade shape. when a plurality of channels of transmission point signals are modulated and multiplexed according to an FDM system, a corresponding number of signal processing systems are disposed according to the plurality of transmission point signals with different modulation rates.

12 Claims, 11 Drawing Sheets

INTERPOLATE WITH MULTIPLE OF TWO

| | INPUT FREQUENCY | OUTPUT FREQUENCY | NUMBER OF TAP COEFFICIENTS |
|---|---|---|---|
| RELATED ART REFERENCE | 480 Hz | 7680 Hz | 931 TAPS |
| PREFERRED EMBODIMENT | 480 Hz | 960 Hz | 63 TAPS |

FIG. 7B

| | NUMBER OF ARITHMETIC OPERATIONS EXECUTED IN ROLL-OFF PORTION | NUMBER OF ARITHMETIC OPERATIONS EXECUTED IN INTERPOLATER PORTION | TOTAL |
|---|---|---|---|
| RELATED ART REFERENCE | $993 \times (15 \div 16) = 931) \times 2 = 1862$ | 0 | 1862 |
| PREFERRED EMBODIMENT | $(125 \div 2 \approx 63) \times 2 = 126$ | $((11 \div 2 = 6) \times 2 = 12) \times 2^4 = 192$ | 318 |

TRANSMISSION SIGNAL PROCESSING APPARATUS

BACKGROUND OF THE INVENTION

1. Field of the Invention

The present invention relates to a transmission signal processing apparatus for use in a modem, for performing a transmission signal process consisting of a roll-off filtering process for limiting the band of a transmission point signal and an interpolation process for raising the sampling frequency of the transmission point signal to a frequency at which the transmission point signal can be modulated.

2. Description of the Related Art

In analog voice band transmission lines such as public telephone transmission lines and dedicated transmission lines, modems (modulation and demodulation units) are being widely used.

In recent years, digital signal processing for encoding and decoding in a modem have been executed by a DSP (Digital Signal Processor) and a MPU (Micro Processing Unit) so as to reduce the size and cost of the modems.

FIGS. 1A, 1B, and 2A to 2D are schematic diagrams for explaining a conventional transmission signal processing portion for use in a model according to a related art reference.

Figure 1A:
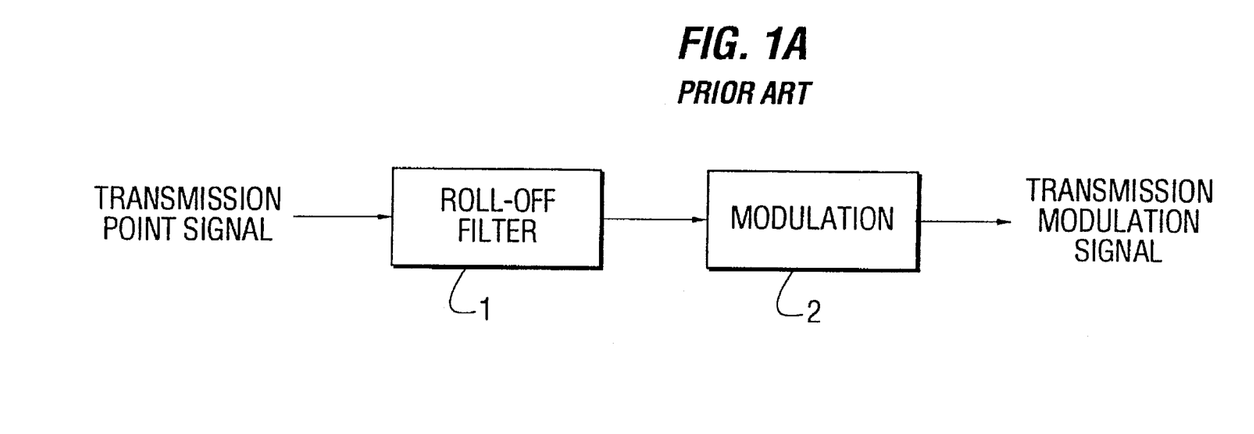
FIGS. 1A and 1B are schematic diagrams (No. 1) for explaining a related art reference.

In the conventional transmission signal process, as shown in FIG. 1A, transmission data is encoded and converted into a transmission point signal. Thereafter, the frequency band of the transmission point signal is limited by a roll-off filtering process executed by a roll-off filter portion 1. The output of the roll-off filter portion 1 is modulated by a modulation portion 2 and thereby a modulated transmission signal is generated.

The roll-off filtering process is a process for limiting the band of a transmission point signal which is an impulse signal without an occurrence of inter-symbol interference so as to allow the signal to travel over a transmission line. This signal process is important and well known as a data transmission technique.

Recently, modems use a frequency division modulation (FDM) system for dividing the frequency band of one transmission signal to be transmitted over a transmission line into a plurality of subbands and for transmitting a plurality of transmission point signal channels with the plurality of subbands.

Figure 1B:
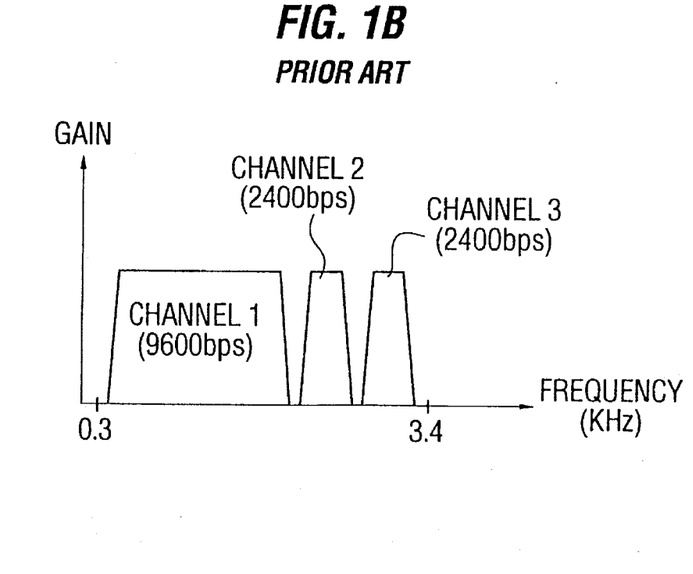

As an example shown in FIG. 1B, a transmission point signal with a transmission rate of 9600 bps (bits per second) on channel 1 and transmission signals with a transmission rate of 2400 bps on channels 2 and 3 are multiplexed in an analog voice band with a frequency characteristic ranging from 0.3 to 3.4 kHz.

Figure 2A:
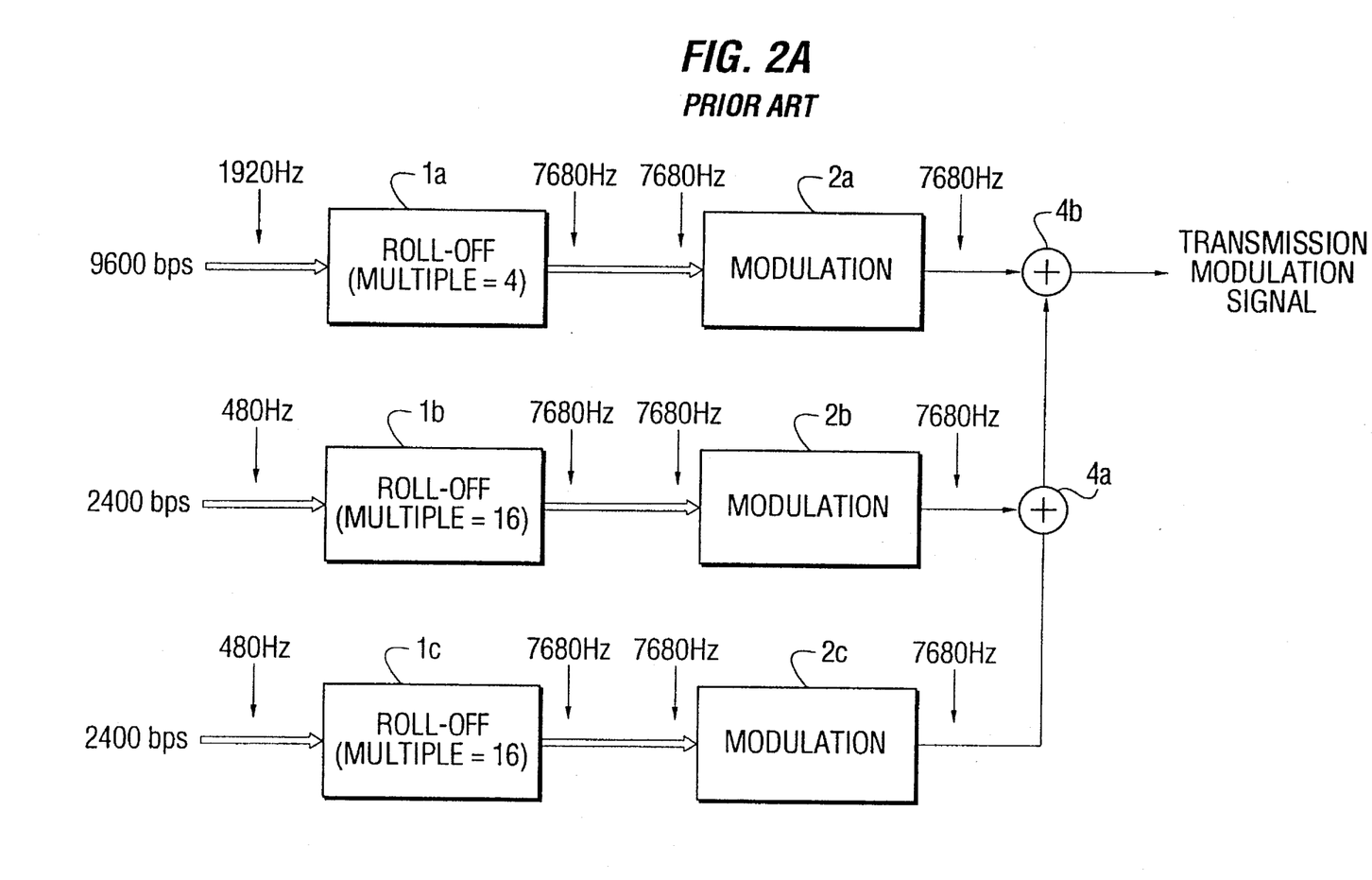
FIGS. 2A to 2D are schematic diagrams (No. 2) for explaining the related art reference.

FIG. 2A shows an example of the construction of a conventional transmission signal processing portion which accomplishes the frequency division modulation shown in FIG. 1B.

Now, assume that an encoding system for converting data of five bits into a transmission point signal is used. In this case, when data with a transmission rate of 9600 bps is converted, the modulation frequency (sampling frequency) of a transmission point signal becomes 1920 Hz (because 9600 Hz/5=1920 Hz).

A roll-off filter portion 1a limits the frequency band of the transmission point signal and performs an interpolation process with a multiple of four. Thus, the sampling frequency (1920 Hz) of the transmission point signal is raised to a frequency equal to the sampling frequency of a transmission signal which is transmitted over a transmission line (this sampling frequency is for example 7680 Hz). In other words, three new samples (4−1=3) with a value of 0 are interpolated or inserted between each sample of the transmission point signal being received. Thus, an output transmission point signal whose sampling frequency is 4 times higher than that of an input transmission point signal is obtained. Then, the above-mentioned roll-off filtering process is performed on the output transmission point signal. Thus, the sampling frequency of the transmission point signal is raised while the frequency component of the original transmission data are kept.

Generally, an interpolation process with a multiple of n is a process for interpolating (n−1) new samples with a value of 0 between each adjacent sample of an input transmission point signal.

The transmission point signal with a frequency of 7680 Hz which is equal to the sampling frequency of the transmission signal which is transmitted over the transmission line is modulated by a modulation portion 2a. Thus, a pass band signal with the frequency characteristic of the channel 1 (shown in FIG. 1B) is obtained.

On the other hand, when the data with the transmission rate of 2400 bps is transformed, the modulation frequency of the resultant transmission point signal becomes 480 Hz (because 2400 Hz/5=480 Hz).

In the sample shown in FIG. 2A, there are two transmission point signal channel with this sampling frequency because there are two signal transmission sources.

Roll-off filter portions 1b and 1c each limit the frequency band of the corresponding channel of the transmission point signal and perform an interpolation process with a multiple of 16 for the signal. Thus, the sampling frequency (480 Hz) of the input signal is raised to the sampling frequency of the transmission signal which is transmitted over the transmission line (the resultant sampling frequency is for example 7680 Hz). In this case, 15 new samples with a value of 0 (because of 16−1=15) are interpolated between each adjacent sample of the input point signal.

The two series of the transmission point signals are sent to modulation portions 2b and 2c, respectively. The modulation portions 2b and 2c modulate the two series of the transmission point signals, respectively. Thus, two channels of pass band signals with the frequency characteristic of the channels 2 and 3 shown in FIG. 1B are obtained.

Thereafter, the output pass band signals of the modulation portions 2b and 2c are sent to an addition portion 4a. The addition portion 4a adds these two pass band signals. The output pass band signal of the modulation portion 2a and the output pass band signal of the addition portion 4a are sent to an addition portion 4b. The addition portion 4b adds these pass band signals. The addition result is sent to a D/A (Digital to Analog) converter (not shown in the figure). The D/A converter converts the input signal into a modulated analog transmission signal and outputs the resultant signal to the transmission line.

Figure 2B:
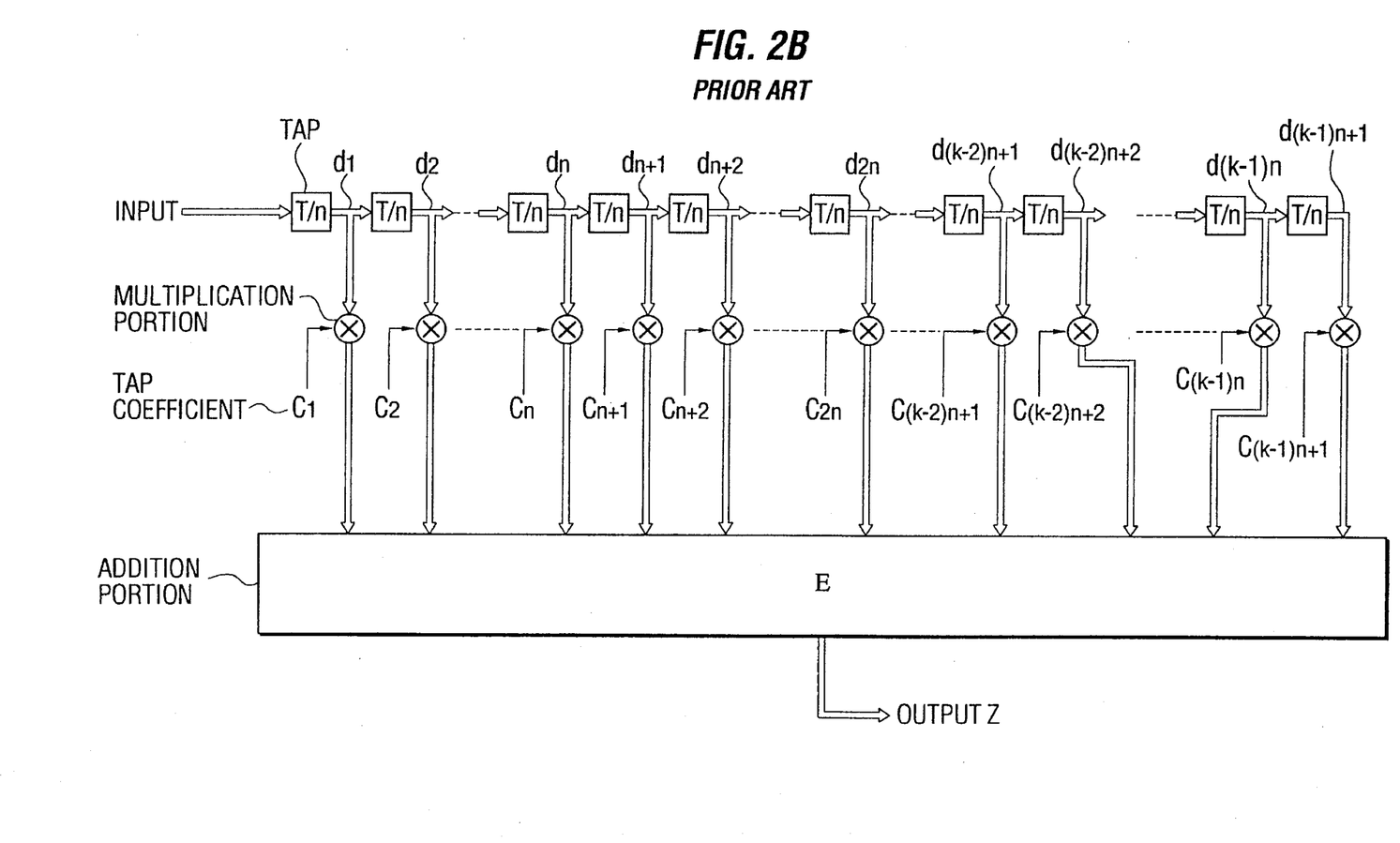

As shown in FIG. 2B, the roll-off filter portions 1a, 1b, and 1c each has the construction of a transversal filter which comprises a plurality of taps, a plurality of multiplication portions, and an addition portion. The taps are connected in a cascade configuration. The output of each tap is connected to one of the multiplication portions. Each multiplication portion multiplies the output of a tap by a tap coefficient. The output of each multiplication portion is sent to the addition potion. The addition portion adds all the outputs of the multiplication portions and outputs the addition result as an output z.

When the interpolation process with a multiple of n is executed, (n–1) samples with a value of 0 are interpolated between each adjacent sample of an original transmission point signal. Thereafter, the resultant signal is sent to the roll-off filter portion 1 at a sampling period T/n (where T is the sampling period before the interpolation process is executed). The resultant signal is sent to the taps which are connected in the cascade configuration, each tap having a delay time of T/n.

In this case, as described above, in the interpolation process with a multiple of n, although one sample of n successive samples of the input signal has the value of an original transmission point signal, other samples thereof, (n–1) samples, have a value of 0.

Thus, at a given time, only tap outputs $d_1$, $d_{n+1}$, ..., $d_{(k-2)n+1}$, and $d_{(k-1)n+1}$ disposed at intervals of n taps apart have the values of the original transmission point signal. The values of other taps are 0. As a result, at this time, the output z can be given by the following formula.

$$z = C_1 d_1 + C_{n+1} d_{n+1} + \ldots + C_{(k-2)n+1} d_{(k-2)n+1} + C_{(k-1)n+1} d_{(k-1)n+1} \quad (1)$$

Next, when a time T/N has elapsed from the above timing, the sample stored at each tap is moved to the tap immediately to the right. Thus, only the tap outputs $d_2$, $d_{n+2}$, ..., and $d_{(k-2)n+2}$ have the value of the original transmission point signal. The values of other tap outputs are 0. Thus, the output z at this time can be given by the following formula.

$$z = C_2 d_2 + C_{n+2} d_{n+2} + \ldots + C_{(k-2)n+2} d_{(k-2)n+2} \quad (2)$$

Likewise, after every T/n time period, the position of each tap output with the value of the original transmission point signal moves one place to the right. When a $\{(n-1) \times T/n\}$ time period elapses from the first point in time, only the tap outputs $d_n$, $d_{2n}$, ..., and $d_{(k-1)n}$ which are disposed at intervals of n taps apart have the values of the original transmission point signal. The values of other tap outputs are 0. thus, the output z at this time can be given by the following formula.

$$z = C_n d_n + C_{2n} d_{2n} + \ldots + C_{(k-1)n} d_{(k-1)n} \quad (3)$$

After a $\{n \times T/n\}$ time period has elapsed from the first point in time, the tap outputs $d_1$, $d_{n+1}$, ..., $d_{(k-2)n+1}$, and $d_{(k-1)n+1}$ which are disposed at intervals of n taps apart have the value of the original transmission point signal. Thus, the output z is also given the formula (1).

According to the formulas (1) to (3), until a $\{(n-1) \times T/n\}$ time period elapses from the first timing, tap outputs of n successive taps $d_1$ to $d_n$ have the value of the original transmission point signal. Likewise, tap outputs of n successive taps $d_{n+1}$ to $d_{2n}$, ..., and $d_{(k-2)n+1}$ to $d_{(k-1)n}$ have the same values, respectively.

Figure 2C:
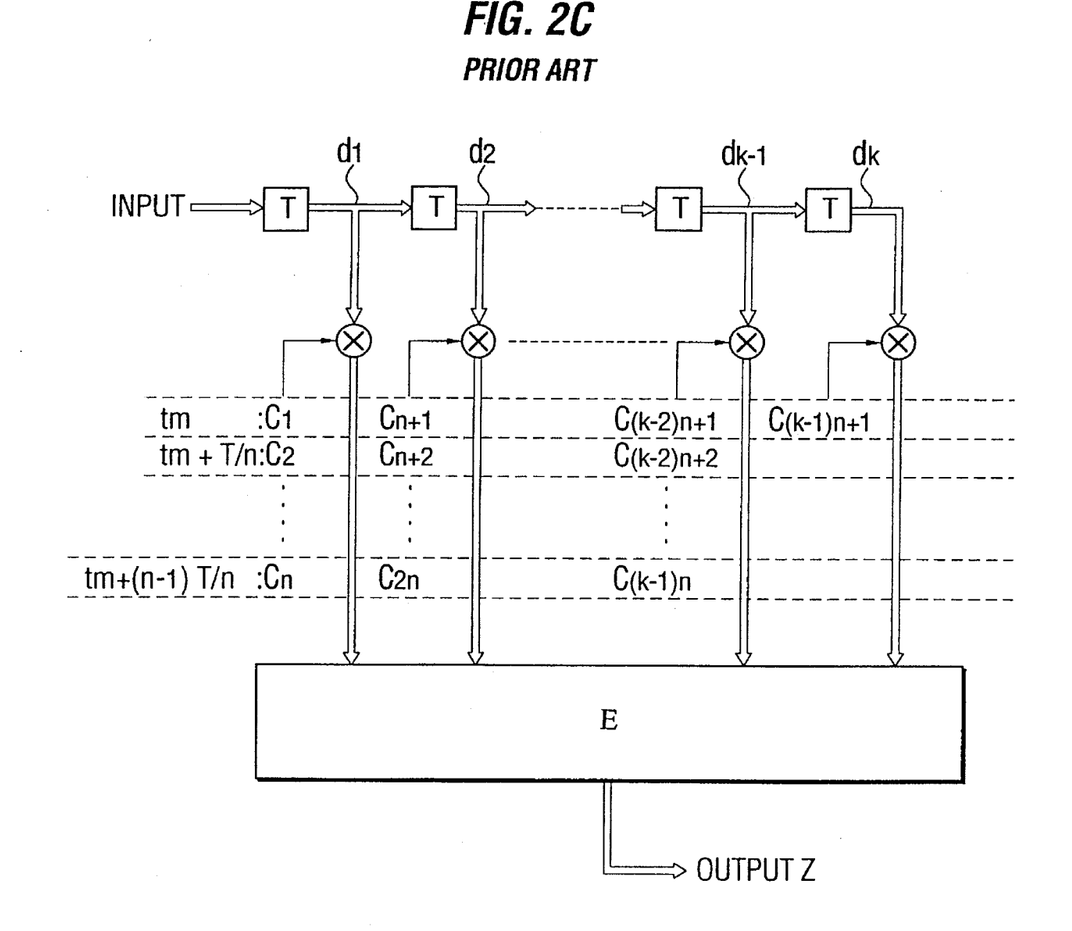

Thus, the (k–1)n+1 taps with a delay time of T/n shown in FIG. 2B can be substituted with k taps with a delay time of T shown in FIG. 2C. When the original transmission point signal with a sampling period of T is inputted to the roll-off filter portion 1, the roll-off filter portion 1 can execute both the interpolation process with a multiple of n and roll-off filtering process at the same time.

In other words, as shown in FIG. 2C, in a predetermined timing $t_m$, k tap outputs $d_1$ to $d_k$ are multiplied by k tap coefficients $C_1$, $C_{n+1}$, ..., $C_{(k-2)n+1}$, and $C_{(k-1)n+1}$ which are disposed at intervals of n taps aparts, respectively, and thereby an output z is obtained. The output z is given by the following formula.

$$z = C_1 d_1 + C_{n+1} d_2 + \ldots + C_{(k-2)n+1} d_{k-1} + C_{(k-1)n+1} d_k \quad (4)$$

Next, in a timing $t_{m+T/n}$ when a T/n time elapses from a timing $t_m$, (k–1) tap outputs $d_1$ to $d_k$ (except for the last tap output) $d_{k-1}$ are multiplies by (K–1) tap coefficients $C_2$, $C_{n+2}$, ..., and $C_{(k-2)n+2}$ which are disposed at just right positions of (k–1) tap coefficients $C_1$, $C_{n+1}$, ..., and $C_{(k-2)n+1}$, respectively, and thereby an output z is obtained. The output z is given by the following formula.

$$z = C_2 d_1 + C_{n+2} d_2 + \ldots + C_{(k-2)n+2} d_{k-1} \quad (5)$$

Likewise, whenever a T/n time elapses, (k–1) tap outputs $d_1$ to $d_k$ which are the same as those in the first timing $t_m$ are multiplied by (k–1) tap coefficients which are disposed at just right positions thereof, respectively. Thus, an output z is obtained. In the timing $t_{m+(n-1)T/N}$ when a $\{(n-1) \times T/n\}$ time elapses from the first timing $t_m$, (k–1) tap outputs $d_1$ to $d_k$ which are the same as those in the first timing are multiplied by (k–1) tap coefficients $C_n$, $C_{2n}$, ..., and $C_{(k-1)n}$, respectively, and thereby an output z is obtained. The output z is given by the following formula.

$$z = C_n d_1 + C_{2n} d_2 + \ldots + C_{(k-1)n} d_{k-1} \quad (6)$$

In a timing $t_{m+T}$ when a T time (namely, $n \times T/n = T$) elapses from the first timing $t_m$, according to the formula (4), (k–1) tap outputs $d_1$ to $d_k$ whose values differ from those in the first timing $t_m$ are multiplied by k tap coefficients $C_1$, $C_{n+1}$, ..., $C_{(k-2)n+1}$ and $C_{(k-1)n+1}$, respectively, and thereby an output z is obtained.

Figure 2D:
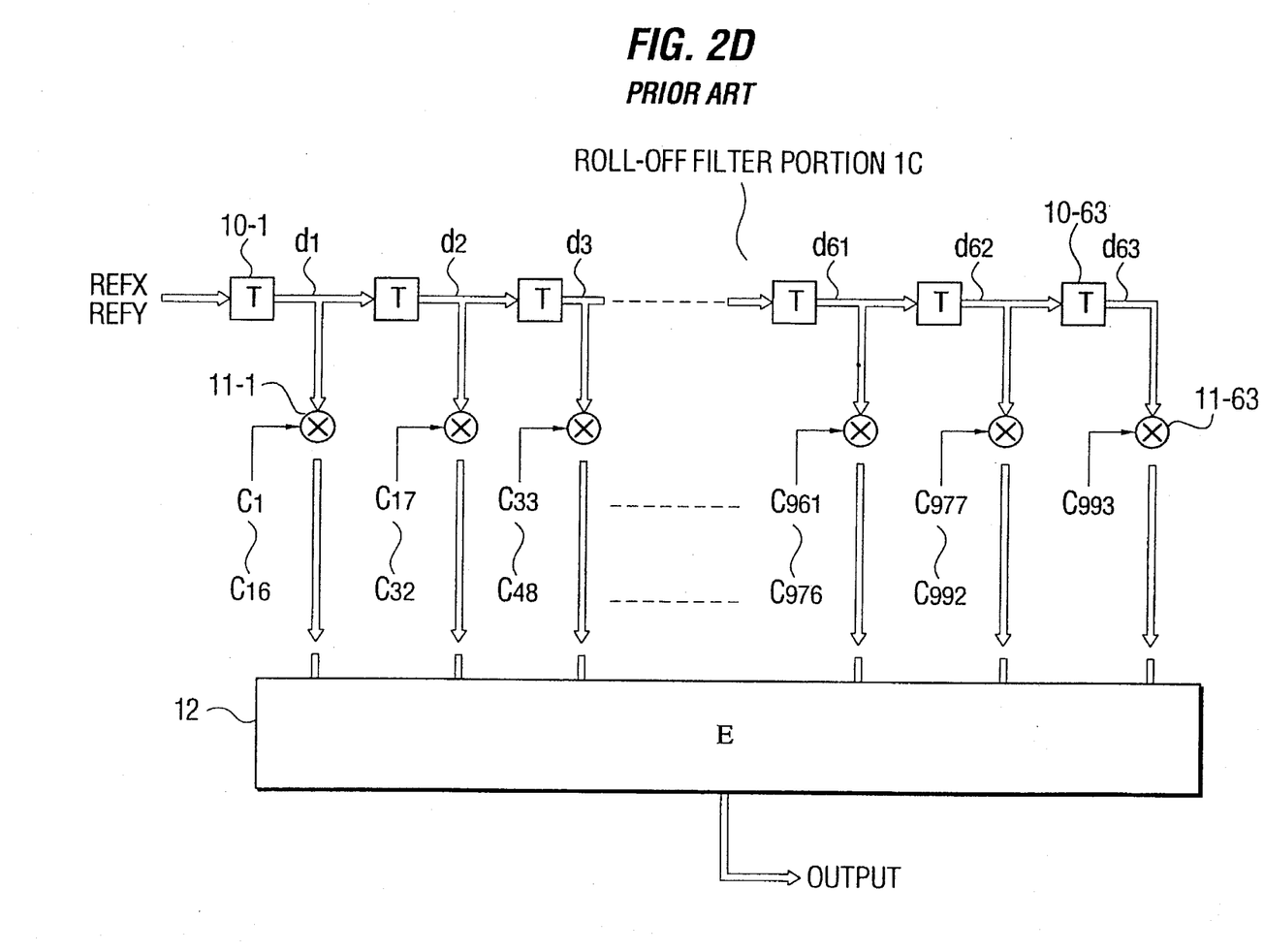

According to the construction of the roll-off filter portion 1 shown in FIG. 2C, the construction of the roll-off filter portions 1b and 1c which execute the interpolation process with a multiple of 16 shown in FIG. 2A can be represented by a construction shown in FIG. 2D. FIG. 2D shows the construction of FIG. 2C where n=16 and k=63 (where n is a multiple of interpolation process; and k is the number of taps).

In this case, the roll-off filter portion comprises 63 taps 10-1 to 10-63, 63 multiplication portions 11-1 to 11-63, and an addition portion 12. Thus, the number of tap coefficients $C_1$ to $C_{(k-1)n+1}$ (namely, $C_1$ to $C_{993}$) is 993.

When the transmission signal process is executed by the DSP as a digital signal process, the taps of the roll-off filter portion 1 are constructed of a RAM (Random Access Memory). The tap coefficients are stored in a ROM (Read Only Memory). The multiplications and additions are executed by an arithmetic and logic unit in the DSP 2.

Since the transmission point signal is inputted as real component REFX and imaginary component REFY, the roll-off filter portion 1 separately processes them.

However, the above-mentioned related art reference as the following problems.

To increase the data transmission rate on a transmission line with a limited band width, the modulation rate should be raised. In particular, when a plurality of channels of transmission point signals are multiplexed according to the FDM system as shown in FIG. 1B, the amount of attenuation of unnecessary band components of each channel should be increased so as to obtain a high S/N ratio. Thus, the transmission point signals should not generate an intersymbol interference. To do that, in the frequency spectrum characteristic of the roll-off filter portion 1, the roll-off ratio of the frequency band of the cut-off region to the entire frequency band width should be lowered so that the cut-off characteristic becomes sharp. As a result, the convergence time of the time region response waveform of the roll-off filter portion 1 becomes long, resulting in an increase of the number of taps k of FIG. 2C.

When the multiple n of the interpolation process of the roll-off filter portion 1 becomes large such as n=16 (as shown in FIG. 2D), the number of groups of the tap coefficients becomes 16. Thus, when the number of taps k becomes large such as k=63 (as shown in FIG. 2D), the number of tap coefficients (k−1)n+1 increases to such as 993 (as shown in FIG. 2D).

When tap coefficients of the roll-off filter portion 1 are selected so that the frequency spectrum characteristic thereof has a special shape referred to as the cosine roll-off shape, some values of tap coefficients of each group become 0. For these tap coefficients, since the multiplications of the tap outputs are not required, the amount of arithmetic operations can be reduced. However, when the multiple n of the interpolation process is high such as n=16 (as shown in FIG. 2D), many samples (16 samples in the case shown in FIG. 2D) are interpolated between each adjacent sample of the time region response waveform of the roll-off filter portion 1. Thus, even if the above-mentioned special response waveform is used, the tap coefficients with a value of 0 are at most one every 16. Thus, the amount of arithmetic operations cannot be reduced.

As described above, according to the related art reference, in the DSP, both the capacity of the ROM which stores the tap coefficients and the amount of arithmetic operation increase. Thus, it is necessary to extend a processor, an external RAM device, and so forth. Thus, the circuit scale increases, resulting in preventing the size and cost of the apparatus from being reduced.

SUMMARY OF THE INVENTION

The present invention is made from the above-mentioned point of view. An object of the present invention is to suppress an increase of the circuit scale of the apparatus with a lower roll-off ratio.

According to the present invention, a plurality of roll-off filter portions are adapted for executing a roll-off filtering process and an interpolation process with a multiple of two for each channel of the transmission point signals, the roll-off filtering process being adapted to form a frequency spectrum characteristic of each channel of the transmission point signals in a cosine roll-off shape.

An interpolator portion is adapted for executing an interpolation process with a multiple of two for input signals, the interpolation process being a filtering process for forming a frequency spectrum characteristic of each channel of the input signals in a cosine roll-off shape, the interpolator portion being executed at least one time, wherein the output of each of the roll-off filter portions is each channel of the input signals when the interpolation process is executed at the first time, and wherein the output of the just preceding process is each channel of the input signals when the interpolation process is executed at the second or later time.

According to the present invention, the number of execution times of the interpolation process of the interpolator portion for each channel of the transmission point signals is given by the following formula:

$$n = \log_2(f1/f2) - 1$$

where f1 is a frequency at each channel of the transmission point signals can be modulated; f2 is a sampling frequency of each channel of the transmission point signals which is inputted to each of the roll-off filter portions; and n is the number of execution times of the interpolation process.

According to the present invention, the interpolation process of the interpolator portion for each channel of the transmission point signals has the same frequency spectrum characteristic when the interpolation process is executed twice or more.

In the construction of the present invention, since the roll-off filter portion and a desired number of interpolation portions connected thereto in a cascade shape execute both the filtering process for forming the frequency spectrum characteristic in a cosine roll-off shape and the interpolation process with a multiple of two at the same time, the sampling frequency of the input transmission point signal is raised to a frequency at which the signal can be modulated. In this case, since the values of the half of the tap coefficients of each filter portion become 0, the number of tap coefficients, the number of multiplications of the tap coefficients, and the number of additions of the multiplication results can be halves. In addition, since the multiple of the interpolation process is as low as 2, the number of groups of the tap coefficients required in the process becomes 2, thereby further reducing the number of taps.

Moreover, in the interpolator portion, it is not necessary to lower the roll-off ratio. Thus, an increase of the number of taps is not required. As a result, the number of tap coefficients can be reduced.

Furthermore, even if a plurality of interpolator portions are connected in a cascade shape or a plurality of systems thereof are disposed for a plurality of channels of transmission point signals, the same frequency spectrum characteristic can be used. Thus, one common interpolation process accomplished by a DSP or the like can be repeatedly executed. Thus, the capacity of the ROM which stores the program data and the tap coefficients can be reduced.

These and other objects, features and advantages of the present invention will become more apparent in light of the following detailed description of a best mode embodiment thereof, as illustrated in the accompanying drawings.

DESCRIPTION OF PREFERRED EMBODIMENTS

Theory of Operation

FIGS. 3A to 3D are schematic diagrams showing the theory of the present invention.

Figure 3A:
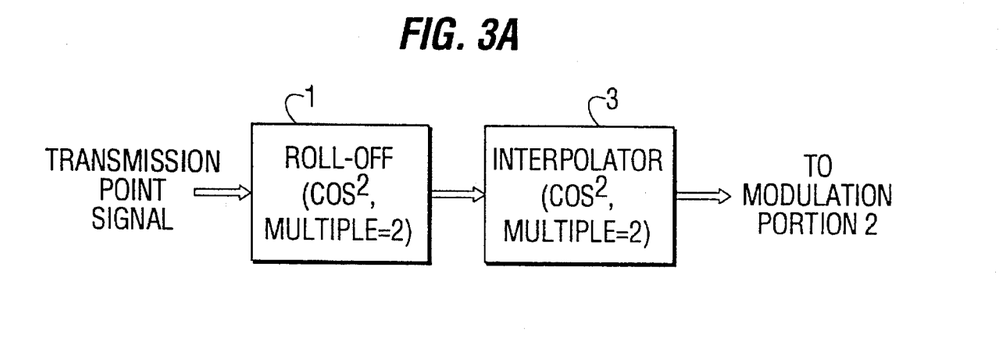
FIGS. 3A to 3D are schematic diagrams showing the theory of the present invention.

In these figures, reference numeral 1 is a roll-off filter portion. The roll-off filter portion 1 executes both a roll-off filtering process and an interpolation process with a multiple of two at the same time. The roll-off filtering process is a process for forming the frequency spectrum characteristic of an input transmission point signal in a cosine roll-off shape. The roll-off filter portion 1 outputs the resultant signal to an interpolator portion 3.

The interpolator portion 3 executes an interpolation process with a multiple of two which is also an interpolation process for forming the frequency spectrum characteristic of the input signal in a cosine roll-off shape.

Depending on what multiple of the original sampling frequency a transmission point signal is interpolated to, a corresponding number of interpolator portions 3 are serially connected. For example, when an interpolation process with a multiple of four is executed, one interpolator portion 3 is connected to the roll-off filter portion 1. Thus, an interpolation process with a multiple of two of the roll-off filter portion 1 and an interpolation process with a multiple of two of one interpolator portion 3 are executed in a cascade shape connection. As a result, an interpolation process with a multiple of four in total is executed (because of 2×2=4). Likewise, when an interpolation process with a multiple of 16 in total is executed, three interpolator portions 3 are connected to the roll-off filter portion 1. Thus, an interpolation process with a multiple of two of the roll-off filter portion 1 and an interpolation process with a multiple of $2^3$ of the three interpolator portions 3 are executed in a cascade shape connection. As a result, an interpolation process with a multiple of 16 in total is executed (because of $2^4$=16).

When a plurality of channels of transmission point signals are multiplexed according to the FDM system, a signal process system comprising one roll-off filter portion 1 and n interpolator portion(s) 3 (where n=0 or any positive integer) are disposed according to each of the channels of the transmission point signals whose modulation rates differ each other. After a modulation process is executed for the output of each signal processing system, all the output signals are added and then sent as a transmission signal to a transmission line.

Figure 3B:
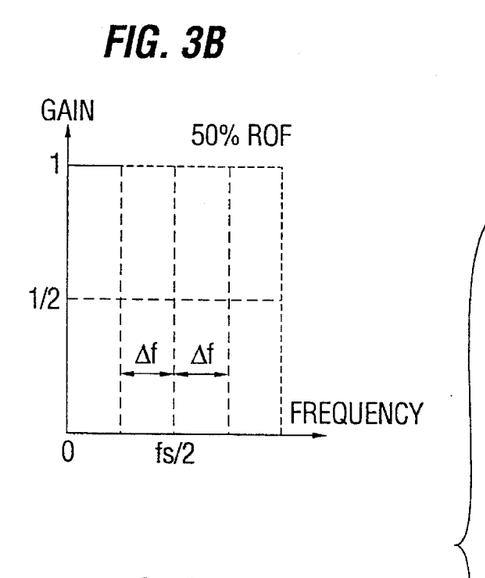
Figure 3C:
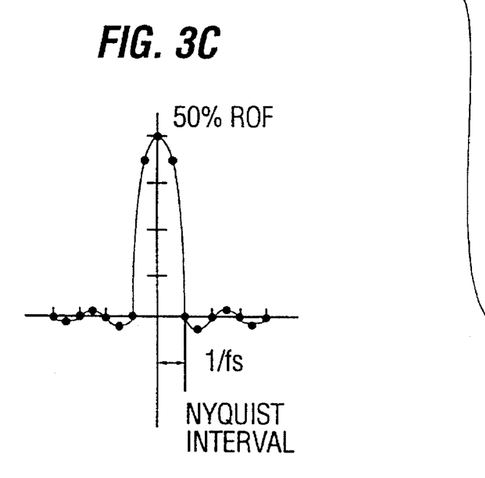
Figure 3D:
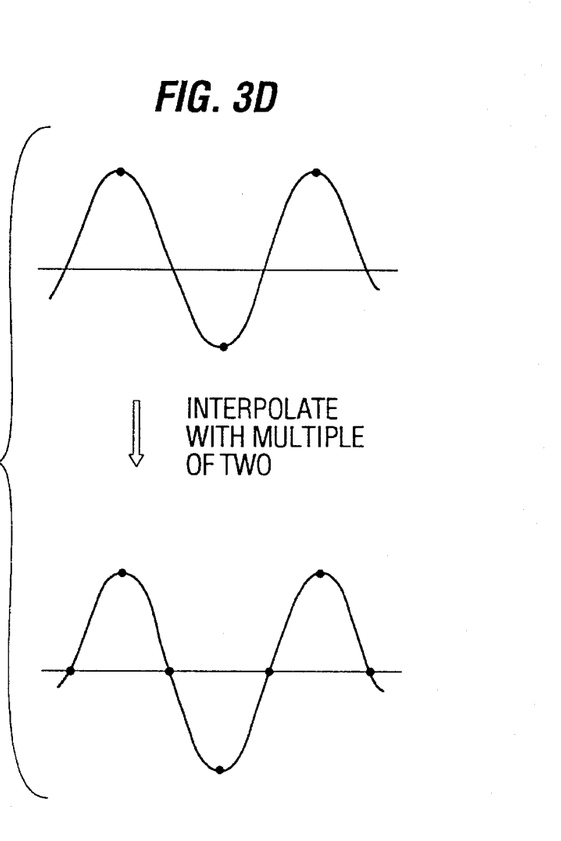

A frequency spectrum characteristic of a filter which converts a transmission point signal in such a way that the signal is transmitted to the receive side in Nyquist intervals (at a sampling period) without an occurrence of inter-symbol interference is known, where zero points of a time region response waveform are disposed equally at Nyquist intervals, the frequency spectrum characteristic having the above-mentioned cosine roll-off shape. A frequency spectrum characteristic having the cosine roll-off shape is shown in FIG. 3B. The time region response waveform is shown in FIG. 3C. In the frequency spectrum characteristic shown in FIG. 3B, the frequency spectrum whose center frequency $1/f_s$ is the ½ frequency of the Nyquist frequency (sampling frequency) has the shape of a cosine waveform. As described above, this shape is referred to as the cosine roll-off shape. In the time region response waveform of the frequency spectrum having the shape shown in FIG. 3B, zero points are disposed equally at the Nyquist intervals (at the sampling period) as shown in FIG. 3C. In FIG. 3B, the ratio of the frequency width $/\Delta/f_s$ between the frequency at which the gain is halved and the frequency at which the gain becomes 0 to the frequency $1/f_2$ at which the gain is halved is referred to as the roll-off ratio.

When the roll-off filter portion 1 executes the roll-off filtering process for forming the frequency spectrum characteristic in the cosine roll-off shape for an input transmission point signal, the values of the time region response waveform shown in FIG. 3C become the values of the tap coefficients of the roll-off filter portion 1. The zero points of the time region response waveform are disposed equally at intervals of the sampling period of the transmission point signal. Thus, when the roll-off filter portion 1 executes an interpolation process with a multiple of two for the input transmission point signal (see FIG. 3D), since one sample is interpolated between each adjacent sample of the time region response waveform based on the sampling period of the input transmission point signal, the values of the tap coefficients of the roll-off filter portion 1 become values represented by plots of FIG. 3C. The value of every other tap coefficient becomes 0. Thus, for these tap coefficients, the multiplications of the tap outputs are not required. As a result, the number of the tap coefficients, the number of multiplications of the tap coefficients, and the number of additions of the multiplication results can be halved in the roll-off filter portion 1.

In addition, as described above, the roll-off ratio of the roll-off filter portion 1 should be lowered. Thus, it is necessary to increase the number of taps. However, according to the present invention, since the multiple of the interpolation process of the roll-off filter portion 1 is as small as two, the number of the groups of the tap coefficients (see FIG. 2C) is two. Thus, although the number of taps is large, the number of tap coefficients in total does not increase so much.

On the other hand, the interpolator portion 3 executes the filtering process for forming the frequency spectrum characteristic of the input signal in the cosine roll-off shape and the interpolation process with a multiple of two. Thus, with the same reason as the roll-off filter portion 1, since the values of the half of the tap coefficients become 0, the number of the tap coefficients, and the number of additions of the multiplication results can be halved.

In this case, as opposed to the roll-off filter portion 1, it is not necessary to lower the roll-off ratio of the interpolator portion 3. Thus, it is not necessary to increase the number of taps. As a result, the number of the tap coefficients, the number of multiplications of the tap coefficients, and the number of additions of the multiplication results can be decreased.

In addition, even if a plurality of interpolator portions 3 are connected in a cascade shape or even if a plurality of systems of the interpolator portions 3 are provided for a plurality of channels of transmission point signals, the same frequency spectrum characteristic can be used. Thus, when the DSP or the like which accomplishes one interpolator portion 3 executes the interpolation process a plurality of times or for a plurality of channels of signals, the same process as a plurality of interpolator portions 3 can be accomplished. Thus, the capacity of the ROM which stores program data and tap coefficients can be reduced.

DESCRIPTION OF PREFERRED EMBODIMENT

Next, a preferred embodiment according to the above-mentioned theory of operation of the present invention will be described.

Figure 4:
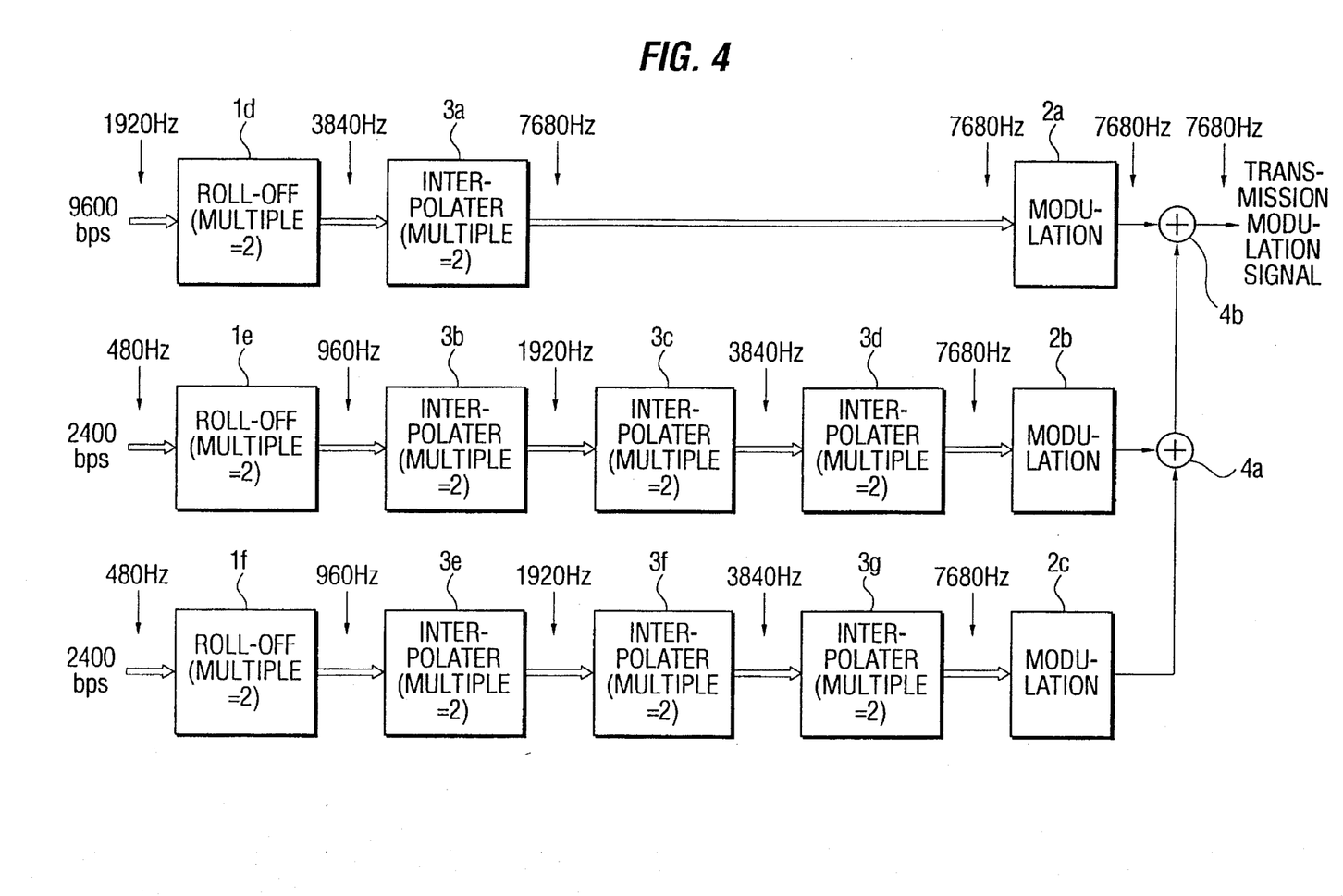
FIG. 4 is a schematic diagram showing the construction of a transmission signal processing portion for use in a modem, of a preferred embodiment according to the present invention.
Figure 5A:
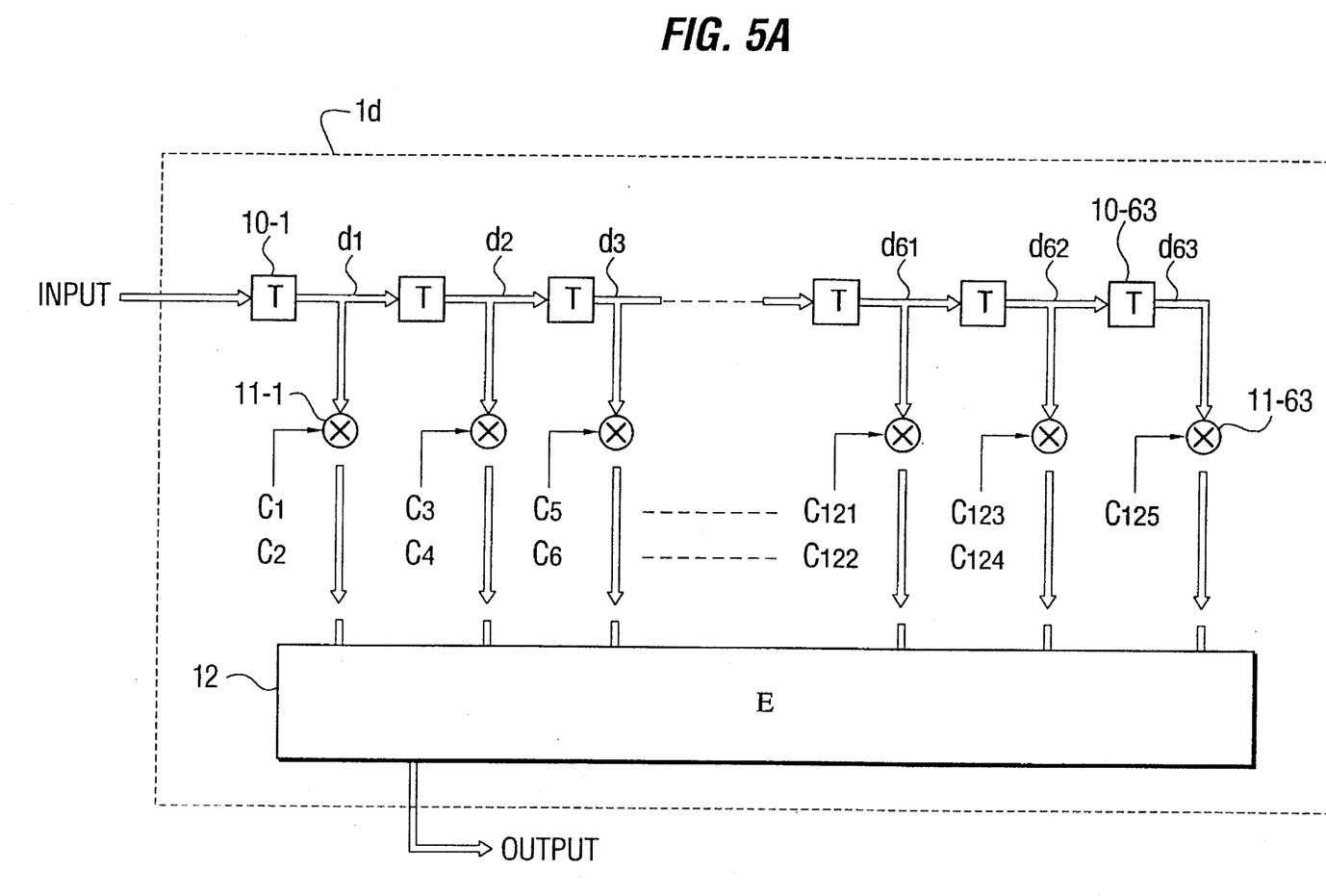
FIGS. 5A and 5B are schematic diagrams showing the construction of each portion of the preferred embodiment of FIG. 4.
Figure 5B:
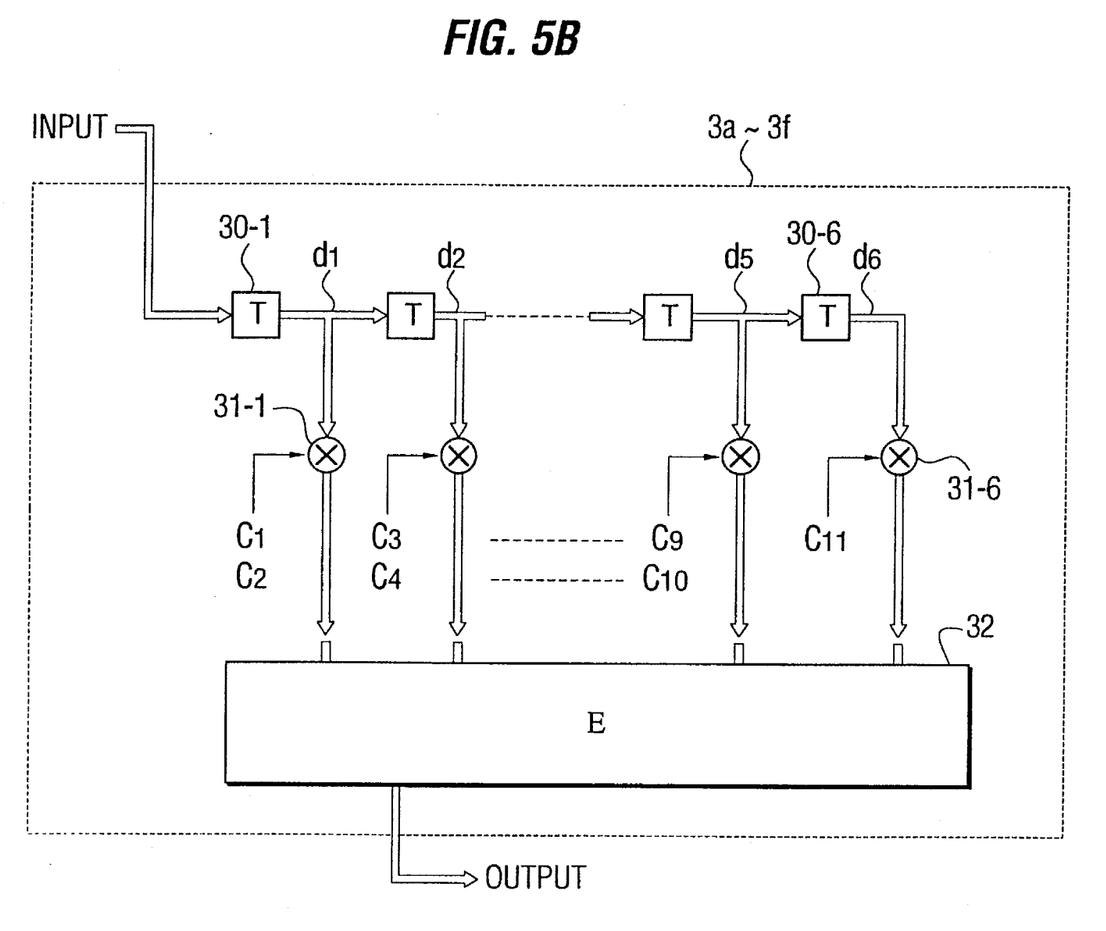
Figure 6:
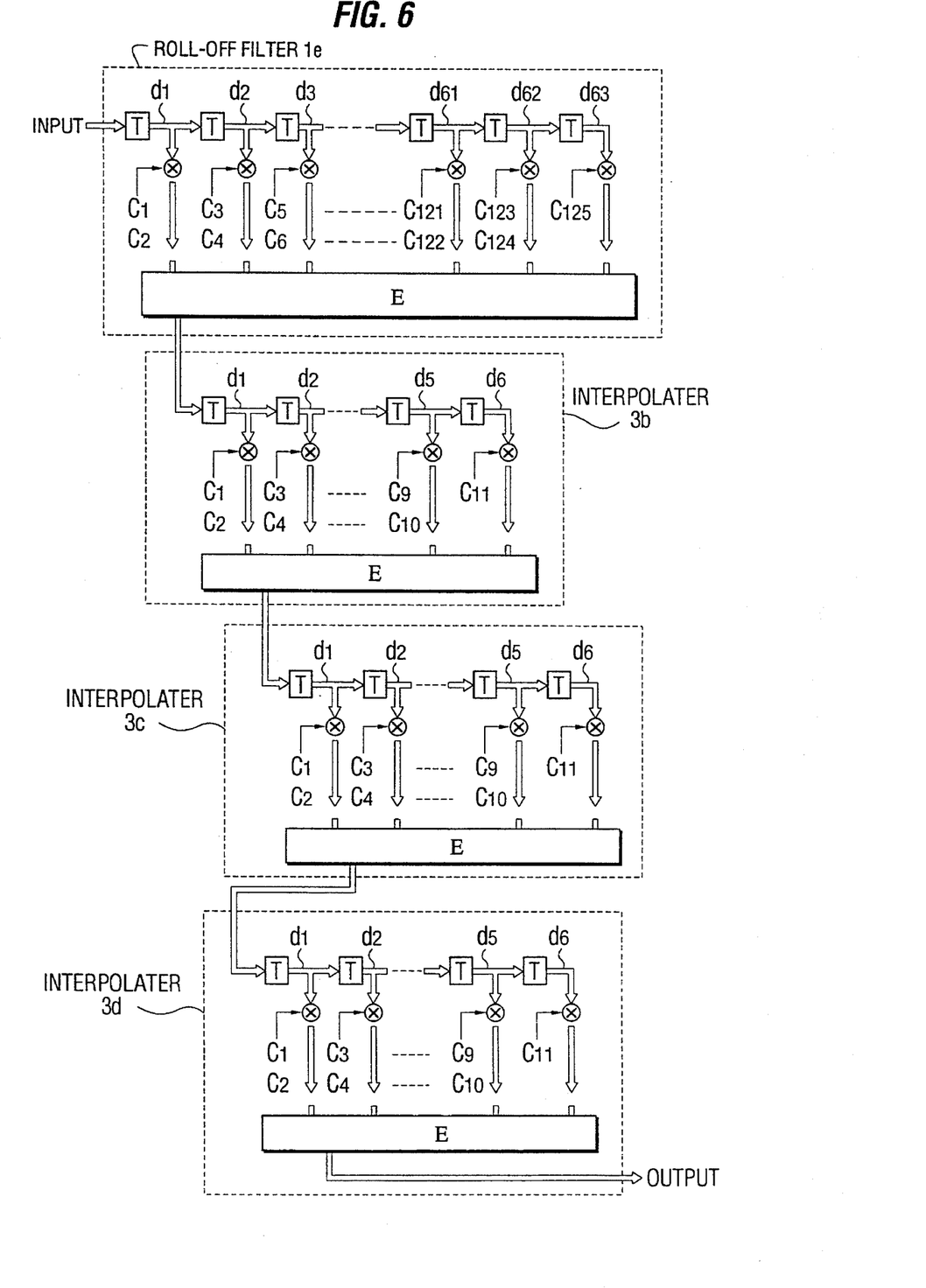
FIG. 6 is a schematic diagram showing the construction of the important part of the preferred embodiment of FIG. 4.
Figure 7A:
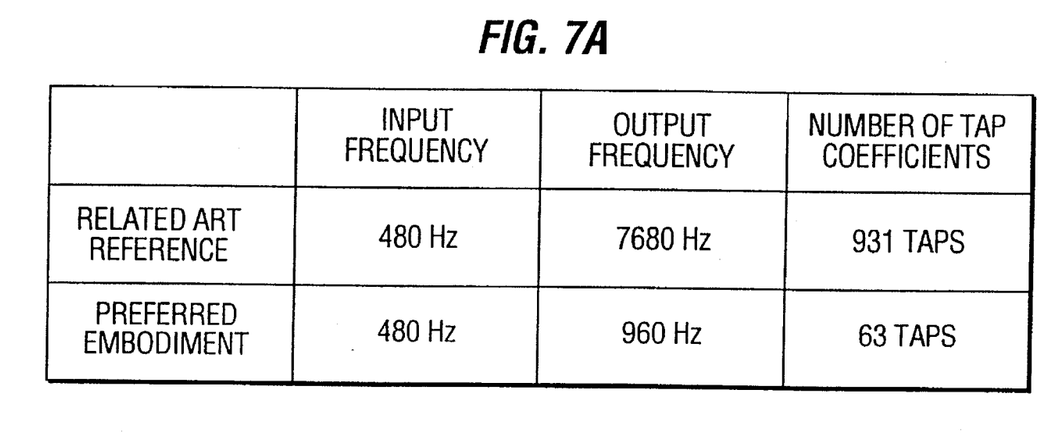
FIGS. 7A and 7B are schematic diagrams for explaining the preferred embodiment of FIGS. 4 to 6.
Figure 7B:
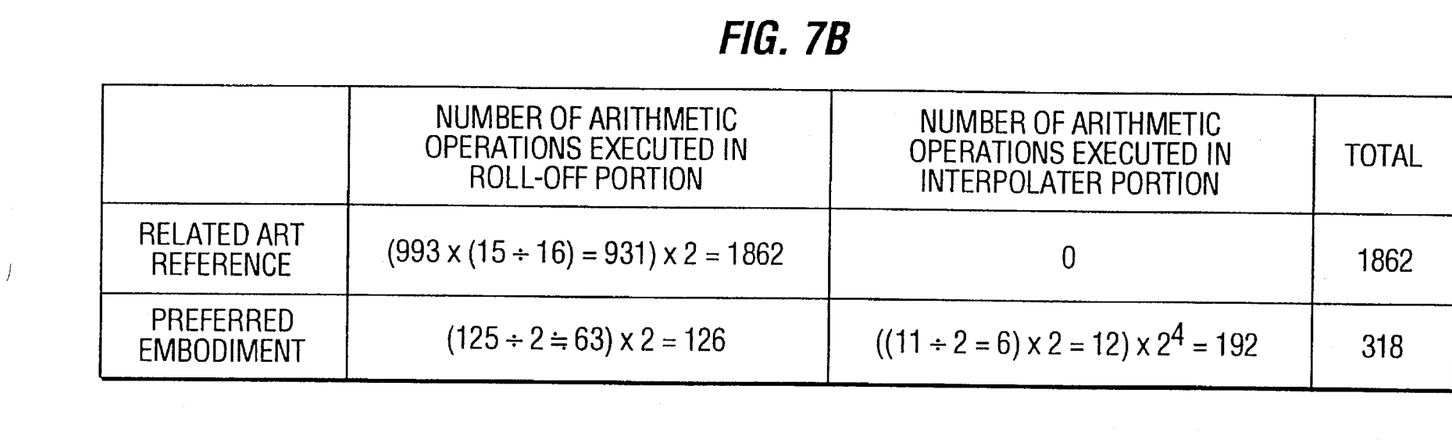

FIG. 4 is a schematic diagram showing the construction of a transmission signal processing portion for use in a modem, of the preferred embodiment according to the present invention. The modem transmits three channels of transmission data whose transmission rates are 9600 bps, 4800 bps, and 2400 bps according to the FDM system. FIGS. 5A and 5B are schematic diagrams showing the construction of each portion of the preferred embodiment of FIG. 4. FIG. 6 is the schematic diagram showing the construction of principal portions of the preferred embodiment of FIG. 4. FIGS. 7A and 7B are schematic diagrams for explaining the preferred embodiment of FIGS. 4 to 6.

In FIG. 4, reference numerals $1d$, $1e$, and $1f$ are roll-off filter portions. The roll-off filter portion $1d$ executes for a transmission point signal with a transmission rate of 9600 bps and a modulation frequency (sampling frequency) of 1920 Hz (9600 Hz/5=1920 Hz) a roll-off filtering process and an interpolation process with a multiple of two at the same time. The roll-off filtering process is a process for forming the frequency spectrum characteristic in a cosine roll-off shape. On the other hand, the roll-off filter portions $1e$ and $1f$ each execute for a corresponding channel of a transmission point signal with a transmission rate of 2400 bps and a modulation frequency of 480 Hz (2400 Hz/5=480 Hz) the roll-off filtering process and the interpolation process with a multiple of two at the same time.

FIG. 5A shows the construction of the roll-off filter portions $1d$, $1d$, and $1f$, the construction being the same as that of FIG. 2C where the multiple of the interpolation process n is 2 and the number of taps k is 63. Each roll-off filter portion comprises 63 taps 10-1 to 10-6, 125 tap coefficients $C_1$ to $C_{125}$, 63 tap multiplication portions 11-1 to 11-63, and an addition portion 12.

As described in the section of the theory of operation, when the multiple of the interpolation process is two, since the values of the half of the tap coefficients are 0, the number of tap coefficients stored in the ROM of the DSP can be reduced to 63 which are nearly the half of 125. In addition, after the interpolation process, the number of multiplications of the tap multiplication portions 11-1 to 11-63 executed by the DSP per sampling period can be reduced to 32 (because of 32/2=16). Moreover, after the interpolation process, the number of additions of the addition portion 12 executed by the DSP per sampling period can be reduced to 31 (because of 32−1=31).

Next, the interpolator portions $3a$ to $3f$ each execute the roll-off filtering process for forming the frequency spectrum characteristic of the corresponding input signal in the cosine roll-off shape and the interpolation process with a multiple of two.

FIG. 5B shows the construction of the roll-off filter portions $3a$ to $3f$, the construction being the same as that of FIG. 2C where the multiple of the interpolation process n is 2 and the number of taps k is 6. Each roll-off filter portion comprises 6 taps 30-1 to 30-6, 11 tap coefficients $C_1$ to $C_{11}$, 6 tap multiplication portions 31-1 to 31-6, and an addition portion 32.

As described in the section of the theory of operation, when the multiple of the interpolation process is two, since the values of the half of the tap coefficients are 0, the number of tap coefficients stored in the ROM of the DSP can be reduced to 6 which are almost the half of 11. In addition, after the interpolation process, the number of multiplications of the tap multiplication portions 31-1 to 31-6 executed by the DSP per sampling period can be reduced to 6 (because of 11/2≐6). Moreover, after the interpolation process, the number of additions of the addition portion 32 executed by the DSP per sampling period can be reduced to 5 (6−1=5).

For one channel of the transmission point signal with the transmission rate of 9600 bps and the modulation frequency (sampling frequency) of 1920 Hz (because of 9600 Hz/5= 1920 Hz), the roll-off filter portion $1d$ executes the roll-off filtering process and converts the sampling frequency from 1920 Hz to 3840 Hz which is twice as high as the received signal. The interpolator portion $3a$ executes the interpolation process with a multiple of two for the transmission point signal received from the roll-off filter portion $1d$ and converts the sampling frequency from 3840 Hz to 7680 Hz which is twice as high as that of the received signal. The resultant signal is sent to a modulation portion $2a$. The modulation portion $2a$ modulates the received signal and outputs a pass band signal with a frequency characteristic of for example the channel 1 shown in FIG. 1B.

On the other hand, for the two channels of the transmission point signals with the transmission rate of 2400 bps and the modulation frequency (sampling frequency) of 480 Hz (because of 2400 Hz/5=480 Hz), the roll-off filter portions $1e$ and $1f$ each execute the roll-off filtering process and converts the sampling frequency from 480 Hz to 960 Hz which is twice higher than that of the received signal. The interpolator portions $3b$ to $3d$ and $3e$ to $3g$ each execute the interpolation process with a multiple of two (namely, an interpolation process with a multiple of eight in total). Thus, they convert the sampling frequency from 960 Hz to 7680 Hz which is eight times higher than that of the received signal. The interpolator portions $3d$ and $3g$ output the resultant signals to modulators $2b$ and $2c$, respectively. The modulators $2b$ and $2c$ modulate the received signals and output two channels of pass band signals with the frequency characteristic of for example the channels 2 and 3 of FIG. 1B.

The output pass band signals of the modulators $2b$ and $2c$ are sent to an addition portion $4a$. The addition portion $4a$ adds these pass band signals. The output signal of the addition portion $4a$ and the output pass band signal of the modulator $2a$ are sent to an addition portion $4b$. The addition portion $4b$ adds these pass band signals. The resultant signal is sent to a D/A (Digital/Analog) converter (not shown in the figure). The D/A converter converts the received signal into an analog transmission modulation signal. The resultant signal is sent to a transmission line.

FIG. 6 shows the construction of the signal processing portion comprising for example the roll-off filter portion $1e$ and the interpolator portions $3b$, $3c$, and $3d$ of FIG. 4. Next, the construction of the roll-off filter portion and the interpolator portions will be compared between the related art reference (FIG. 2D) and the preferred embodiment (FIG. 6).

First, the roll-off filter portion is compared. As shown in FIG. 7A, according to the related art reference shown in FIG. 2D, when the multiple of the interpolation process, n, is 16 and the number of taps, k, is 63, the number of tap coefficients, {k−1)n+1}, becomes 993. However, since the multiple of the interpolation process is 16, the values of 62 of 993 tap coefficients (because of 993/16≐62) become 0. Thus, the substantial number of tap coefficients becomes 931 (because of 993−62=931).

On the other hand, according to the preferred embodiment of FIG. 6, when the multiple of interpolation process, n, is 2 and the number of taps, k, is 63, the number of tap coefficients, (k−1)n+1, becomes 125. However, since the multiple of the interpolation process is 2, the values of 62 of 125 tap coefficients are 0 (because of 125/2≐62) are 0. Thus, the substantial number of tap coefficients (words) becomes 63 (because of 125−62=63). When 63 taps (words) and the number of tap coefficients of each of interpolator portions 3b to 3d (6×3=18 taps (words)) are added, the total is 81 taps (words) (because of 63+18=81).

Thus, according to the preferred embodiment, the capacity of the ROM which stores the tap coefficients can be reduced to approximately 1/12 of that required for the related art reference of FIG. 2D. Thus, according to the preferred embodiment, the capacity of the ROM which stores the tap coefficients can be much reduced in comparison with that of the related art reference.

Next, the number of arithmetic operations in the roll-off filtering process and the interpolation process will be compared between the related art reference and the preferred embodiment. As shown in FIG. 7B, according to the related art reference of FIG. 2D, since multiplications for two types of data which are real component and imaginary component are executed using 931 tap coefficients which are substantially valid, after the interpolation process, the number of arithmetic operations per sampling period becomes 1862 (because of 931×2=1862).

On the other hand, according to the preferred embodiment of FIG. 6, since the roll-off filter portion 1e executes multiplications of two types of data which are real component and imaginary component using 63 tap coefficients which are substantially valid, after the interpolation process, the number of arithmetic operations per sampling period becomes 126 (because of 63×2=126).

In addition, according to the preferred embodiment of FIG. 6, since the interpolator portions 3b, 3c, and 3d each execute multiplications of two types of data which are real component and imaginary component using six tap coefficients which are substantially valid, the number of arithmetic operations becomes 12 (because of 6×2=12). While the roll-off filter portion 1e outputs two samples, the interpolator portion 3b executes arithmetic operations for four samples and outputs the four samples. While the interpolator portion 3b outputs four samples, the interpolator portion 3c executes arithmetic operations for eight samples and outputs the eight samples. While the interpolator portion 3c outputs eight samples, the interpolator portion 3d executes arithmetic operations for 16 samples and outputs the 16 samples. Thus, the total of multiplications executed by the interpolator portions 3b, 3c, and 3d becomes 192 (because of 12×16=192).

Thus, according to the preferred embodiment of FIG. 6, 318 multiplications (because of 126+192=318) are executed.

In other words, according to the preferred embodiment, the number of arithmetic operations necessary for multiplications for required tap coefficients can be reduced to approximately 1/6 of that of the related art reference of FIG. 2D. Thus, according to the preferred embodiment, the processing capacity of the DSP can be reduced.

Moreover, as described in the section of theory of operation (see FIG. 4), even if a plurality of interpolator portions 3a to 3f are connected in a cascade shape or even if a plurality of systems thereof are disposed for a plurality of channels of transmission point signals, the same frequency spectrum characteristic can be used. Thus, by executing the interpolation process of one interpolator portion accomplished by the DSP or the like a plurality of time or for a plurality of channels, a process equivalent to the process performed by a plurality of interpolator portions can be accomplished. Thus, the capacity of the ROM which stores program data and tap coefficients can be reduced.

In the above-mentioned preferred embodiment, a model which operates according to the FDM system was described.

However, it should be noted that besides such a model, the present invention can be applied to a system which transmits one channel of transmission data.

In addition, the number of tap coefficients of the roll-off filter portion and the interpolator portion can be freely selected.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A transmission signal processing apparatus comprising:

roll-off filter means for executing a roll-off filtering process and an interpolation process with a multiple of two for a transmission point signal to limit a frequency band of said transmission point signal, said roll-off filtering process being adapted to form a frequency spectrum characteristic of said transmission point signal in a cosine roll-off shape; and interpolation means for executing an interpolation process with a multiple of two for a signal received from said roll-off filter means, the interpolation process being a filtering process for forming a frequency spectrum characteristic of said received signal in a cosine roll-off shape, the interpolation process being executed at least one time to raise a sampling frequency of said received signal to a frequency at which said transmission point signal can be modulated.

2. A transmission signal processing apparatus comprising:

roll-off filter means for executing a roll-off filtering process and an interpolation process with a multiple of two for a transmission point signal to limit a frequency band of said transmission point signal, said roll-off filtering process being adapted to form a frequency spectrum characteristic of said transmission point signal in a cosine roll-off shape; and interpolator means for executing an interpolation process with a multiple of two for a signal received from said roll-off filter means, the interpolation process being a filtering process for forming a frequency spectrum characteristic of said received signal in a cosine roll-off shape, the interpolation process being executed at least one time to raise a sampling frequency of said received signal to a frequency at which said transmission point signal can be modulated, wherein the number of execution times of said interpolation process of said interpolator means is given by the following formula:

$$n = \log 2(f1/f2) - 1$$

where f1 is a frequency at which said transmission point signal can be modulated; f2 is a sampling frequency of said transmission point signal which is inputted to said roll-off filter means; and n is the number of execution times of said interpolation process.

3. A transmission signal processing apparatus comprising:

roll-off filter means for executing a roll-off filtering process and an interpolation process with a multiple of two for a transmission point signal to limit a frequency band of said transmission point signal, said roll-off filtering process being adapted to form a frequency spectrum characteristic of said transmission point signal in a cosine roll-off shape; and interpolator means for executing an interpolation process with a multiple of two for a signal received from said roll-off filter means, the interpolation process being a filtering process for forming a frequency spectrum characteristic of said received signal in a cosine roll-off shape, the interpolation process being executed at least one time to raise a sampling frequency of said received signal to a frequency at which said transmission point signal can be modulated, wherein said interpolation process of said interpolator means has the same frequency spectrum characteristic when said interpolation process is executed twice or more.

4. A transmission signal processing apparatus which has a plurality of channels for receiving a plurality of transmission point signals, comprising:

roll-off filer means for executing a roll-off filtering process and an interpolation process with a multiple of two for a corresponding transmission point signal of said plurality of transmission point signals to limit a frequency band of said transmission point signal, said roll-off filtering process being adapted to form a frequency spectrum characteristic of said transmission point signal in a cosine roll-off shape; and interpolator means for executing an interpolation process with a multiple of two for a signal received from said roll-off filter means, the interpolation process being a filtering process for forming a frequency spectrum characteristic of said received signal in a cosine roll-off shape, said interpolation process being executed at least one time to raise a sampling frequency of said received signal to a frequency at which said transmission point signal can be modulated.

5. A transmission signal processing apparatus which has a plurality of channels for receiving a plurality of transmission point signals, comprising:

roll-off filter means for executing a roll-off filtering process and an interpolation process with a multiple of two for a corresponding transmission point signal of said plurality of transmission point signals to limit a frequency band of said transmission point signal, said roll-off filtering process being adapted to form a frequency spectrum characteristic of said transmission point signal in a cosine roll-off shape; and interpolator means for executing an interpolation process with a multiple of two for a signal received from said roll-off filter means, the interpolation process being a filtering process for forming a frequency spectrum characteristic of said received signal in a cosine roll-off shape, said interpolation process being executed at least one time to raise a sampling frequency of said received signal to a frequency at which said transmission point signal can be modulated, wherein the number of execution times of said interpolation process of said interpolator means for said transmission point signal is given by the following formula:

$$n=\log2(f1/f2)-1$$

where f1 is a frequency at which said transmission point signal can be modulated; f2 is a sampling frequency of said transmission point signal which is inputted to said roll-off filter means; and n is the number of execution times of said interpolation process.

6. A transmission signal processing apparatus which has a plurality of channels for receiving a plurality of transmission point signals, comprising:

roll-off filter means for executing a roll-off filtering process and an interpolation process with a multiple of two for a corresponding transmission point signal of said plurality of transmission point signals to limit a frequency band of said transmission point signal, said roll-off filtering process being adapted to form a frequency spectrum characteristic of said transmission point signal in a cosine roll-off shape; and interpolator means for executing an interpolation process with a multiple of two for a signal received from said roll-off filter means, the interpolation process being a filtering process for forming a frequency spectrum characteristic of said received signal in a cosine roll-off shape, said interpolation process being executed at least one time to raise a sampling frequency of said received signal to a frequency at which said transmission point signal can be modulated.

wherein said interpolation process of said interpolator means for said transmission point signal has the same frequency spectrum characteristic when said interpolation process is executed twice or more.

7. A transmission signal processing apparatus comprising:

roll-off filter means for executing a roll-off filtering process and an interpolation process with a multiple of two for a transmission point signal to limit a frequency band of said transmission point signal, said roll-off filtering process being adapted to form a frequency spectrum characteristic or said transmission point signal in a cosine roll-off shape; and interpolator means for executing an interpolation process with a multiple of two for a signal received from said roll-off filter means, the interpolation process being a filtering process for forming a frequency spectrum characteristic of said received signal in a cosine roll-off shape, at least one interpolator means being arranged in a cascade to raise a sampling frequency of said received signal to a frequency at which said transmission point signal can be modulated.

8. A transmission signal processing apparatus comprising:

roll-off filter means for executing a roll-off filtering process and an interpolation process with a multiple of two for a transmission point signal to limit a frequency band of said transmission point signal, said roll-off filtering process being adapted to form a frequency spectrum characteristic of said transmission point signal in a cosine roll-off shape; and interpolator means for executing an interpolation process with a multiple of two for a signal received form said roll-off filter means, the interpolation process being a filtering process for forming a frequency spectrum characteristic of said received signal in a cosine roll-off shape, at least one interpolator means being arranged in a cascade to raise a sampling frequency of said received signal to a frequency at which said transmission point signal can be modulated, wherein the number of said interpolator means is given by the following formula:

$$n=\log2(f1/f2)-1$$

where f1 is a frequency at which said transmission point signal can be modulated; f2 is a sampling frequency of said transmission point signal which is inputted to said roll-off filter means; and n is the number of said interpolator means.

9. A transmission signal processing apparatus comprising;

roll-off filter means for executing a roll-off filtering process and an interpolation process with a multiple of two for a transmission point signal to limit a frequency band of said transmission point signal, said roll-off filtering process being adapted to form a frequency spectrum characteristic of said transmission point signal in a cosine roll-off shape; and interpolator means for executing an interpolation process with a multiple of two for a signal received from said roll-off filter means, the interpolation process being a filtering process for forming a frequency spectrum characteristic of said received signal in a cosine roll-off shape, at least one interpolator means being arranged in a cascade to raise a sampling frequency of said received signal to a frequency at which said transmission point signal can be modulated, herein said interpolator means has the same frequency spectrum characteristic when the number of said interpolation means is two or more.

10. A transmission signal processing apparatus which has a plurality of channels for receiving a plurality of transmission point signals, comprising:

roll-off filter means for executing a roll-off filtering process and an interpolation process with a multiple of two for a corresponding transmission point signal of said plurality of transmission point signals to limit a frequency band of said transmission point signal, said roll-off filtering process being adapted to form a frequency spectrum characteristic of said transmission point signal in a cosine roll-off shape; and interpolator means for executing an interpolation process with a multiple of two for a signal received from said roll-off filter means, the interpolation process being a filter process for forming a frequency spectrum characteristic of said received point signal in a cosine roll-off shape, at least one said interpolator means being arranged in a cascade to raise a sampling frequency of said received signal to a frequency at which said transmission point signal can be modulated.

11. A transmission signal processing apparatus which has a plurality of channels for receiving a plurality of transmission point signals, comprising:

roll-off filer means for executing a roll-off filtering process and an interpolation process with a multiple of two for a corresponding transmission point signal of said plurality of transmission point signals to limit a frequency band of said transmission point signal, said roll-off filtering process being adapted to form a frequency spectrum characteristic of said transmission point signal in a cosine roll-off shape; and interpolator means for executing an interpolation process with a multiple of two for a signal received from said roll-off filter means, the interpolation process being a filtering process for forming a frequency spectrum characteristic of said received signal in a cosine roll-off shape, at least one said interpolator means being arranged in a cascade to raise a sampling frequency of said received signal to a frequency at which said transmission point signal can be modulated, wherein the number of said interpolator means for said transmission point signal is given by the following formula:

$$n - \log_2(f1/f2) - 1$$

where f1 is a frequency at which said transmission point signal can be moduatled: f2 is a sampling frequency of said transmission point signal which is inputted to said roll-off filter means: and n is the number of said interpolator means.

12. A transmission signal processing apparatus which has a plurality of channels for receiving a plurality of transmission point signals, comprising:

roll-off filter means for executing a roll-off filtering process and an interpolation process with a multiple of two for a corresponding transmission point signal of said plurality of transmission point signals to limit a frequency band of said transmission point signal, said roll-off filtering process being adapted to form a frequency spectrum characteristic of said transmission point signal in a cosine roll-off shape; and interpolator means for executing an interpolation process with a multiple of two for a signal received from said roll-off filter means, the interpolation process being a filtering process for forming a frequency spectrum characteristic of said transmission point signal in a cosine roll-off shape, at least one said interpolator means being arranged in a cascade to raise a sampling frequency of said received signal to a frequency at which said transmission point signal can be modulated, wherein said interpolator means has the same frequency spectrum characteristic when the number of said interpolator means is two or more.

\* \* \* \* \*